(12) United States Patent
Bazes

(10) Patent No.: US 7,236,518 B2
(45) Date of Patent: Jun. 26, 2007

(54) DESKEWING DIFFERENTIAL REPEATER

(75) Inventor: Mel Bazes, Haifa (IL)

(73) Assignee: Intel Corporation, Santa Clara, CA (US)

(*) Notice: Subject to any disclaimer, the term of this patent is extended or adjusted under 35 U.S.C. 154(b) by 717 days.

(21) Appl. No.: 10/280,873

(22) Filed: Oct. 24, 2002

(65) Prior Publication Data
US 2004/0081246 A1 Apr. 29, 2004

(51) Int. Cl.
*H04L 25/52* (2006.01)
(52) U.S. Cl. .................... 375/214; 375/211
(58) Field of Classification Search ........... 375/211, 375/214, 213; 327/51, 52; 365/207
See application file for complete search history.

(56) References Cited

U.S. PATENT DOCUMENTS

| | | | |
|---|---|---|---|
| 4,412,335 A | 10/1983 | Froment et al. | |
| 5,581,207 A | 12/1996 | Bazes | |
| 5,801,549 A | 9/1998 | Cao et al. | |
| 5,801,564 A | 9/1998 | Gasparik | |
| 6,344,761 B2 * | 2/2002 | Nishimura et al. | 327/55 |
| 6,433,605 B1 | 8/2002 | Zhang | |
| 6,463,092 B1 * | 10/2002 | Kim et al. | 375/219 |
| 6,788,113 B2 * | 9/2004 | Watanabe et al. | 327/66 |
| 2002/0057612 A1 * | 5/2002 | Kanetani et al. | 365/203 |
| 2002/0097068 A1 * | 7/2002 | Morgan | 326/86 |

* cited by examiner

*Primary Examiner*—Khai Tran
(74) *Attorney, Agent, or Firm*—Fish & Richardson P.C.

(57) ABSTRACT

A device including an input to receive a differential waveform pair from a transmission line, the differential waveform pair including a first waveform and a second waveform. The device also includes a repeater to generate a refreshed first output waveform and a refreshed second output waveform. The refreshed first output waveform is substantially similar to an inverted copy of the first waveform and is generated after a signal transition of the first waveform and after a complementary signal transition of the second waveform. The refreshed second output waveform is substantially similar to an inverted copy of the second waveform and is generated substantially simultaneously with generation of the first output waveform.

31 Claims, 9 Drawing Sheets

CONVENTIONAL ART

DESKEWING DIFFERENTIAL REPEATER

BACKGROUND

Noise sensitive signals are usually transmitted as a differential pair. The two signals of the differential pair are affected substantially in the same manner by noise and, therefore, taking the difference between the two signals at their destination may cancel a significant portion of the noise added to the signals during transmission.

If the differential pair signals are transmitted over long transmission lines, the signals may degrade due to noise caused by the parasitic series resistance, inductance, and coupling capacitance in the transmission lines. These parasitic elements attenuate high-frequency signal components more than low-frequency signal components and thereby cause a "smearing" or degradation of the waveform of the signals. If the transmission lines are sufficiently long, the degradation may cause the signals to be completely indecipherable by the time they reach the end of the transmission lines.

To overcome this degradation, repeaters may be inserted along the transmission line at regular intervals. FIG. 1 shows multiple differential repeaters 100 used to propagate differential inputs INA and INB along a differential transmission line 105. A termination block 110 is connected to the end of the transmission line 105 and may be optionally used to the end of the transmission line 105 and may be optionally used for interfacing the received differential signal with a receiving circuit (not shown).

FIG. 2 shows an example of a differential amplifier 200 that may be used as a differential repeater (e.g., 100 in transmission line 105). The differential amplifier 200 includes a DC current source 205, two output resistors 210, and two n-type transistors 215. The differential inputs, INA and INB, are amplified by the differential amplifier 200 which outputs them at OUTA and OUTB. However, the use of the differential amplifier 200 as a repeater suffers from several drawbacks.

First, the differential amplifier 200 exhibits high power dissipation caused by the constant current consumption of the DC current source 205. When multiple differential amplifiers 200 are used to drive transmission lines the resulting power dissipation worsens and may become intolerable.

Second, the differential amplifier 200 exhibits low-drive capability caused by the two output resistors 210 forming a low-pass filter with the transmission line capacitance. The attenuation of high-frequency signal components caused by the low pass filter may be lessened by decreasing the resistance of the output resistors 210. However, decreasing the resistance of resistors 210 requires a proportionate increase in the DC current source 205 that results in increased power consumption.

Third, skew between the two differential inputs INA and INB of the differential amplifier 200 may result. Skew may build between the inputs INA and INB because of a physical mismatch between the two transmission lines on which the signals travel. The skew distorts waveforms and progressively worsens as the differential signal propagates along the transmission line.

FIG. 3 shows an example of the distortion effect of skew on a differential signal A-B. The distortion effect progressively worsens as skew between the signals A and B increases as the differential signal travels along a transmission line. For example, no skew is evident when the signals are at the signal source 300. Some skew is apparent when the signals have traveled to the middle of the transmission line 305, and significant skew and distortion are shown when the signals have reached their destination 310. In addition, as skew builds, noise affects the two signals A and B unequally, thereby resulting in increased noise interference in the form of jitter.

DESCRIPTION OF DRAWINGS

Like reference symbols in the various drawings indicate like elements.

DETAILED DESCRIPTION

Figure 1:
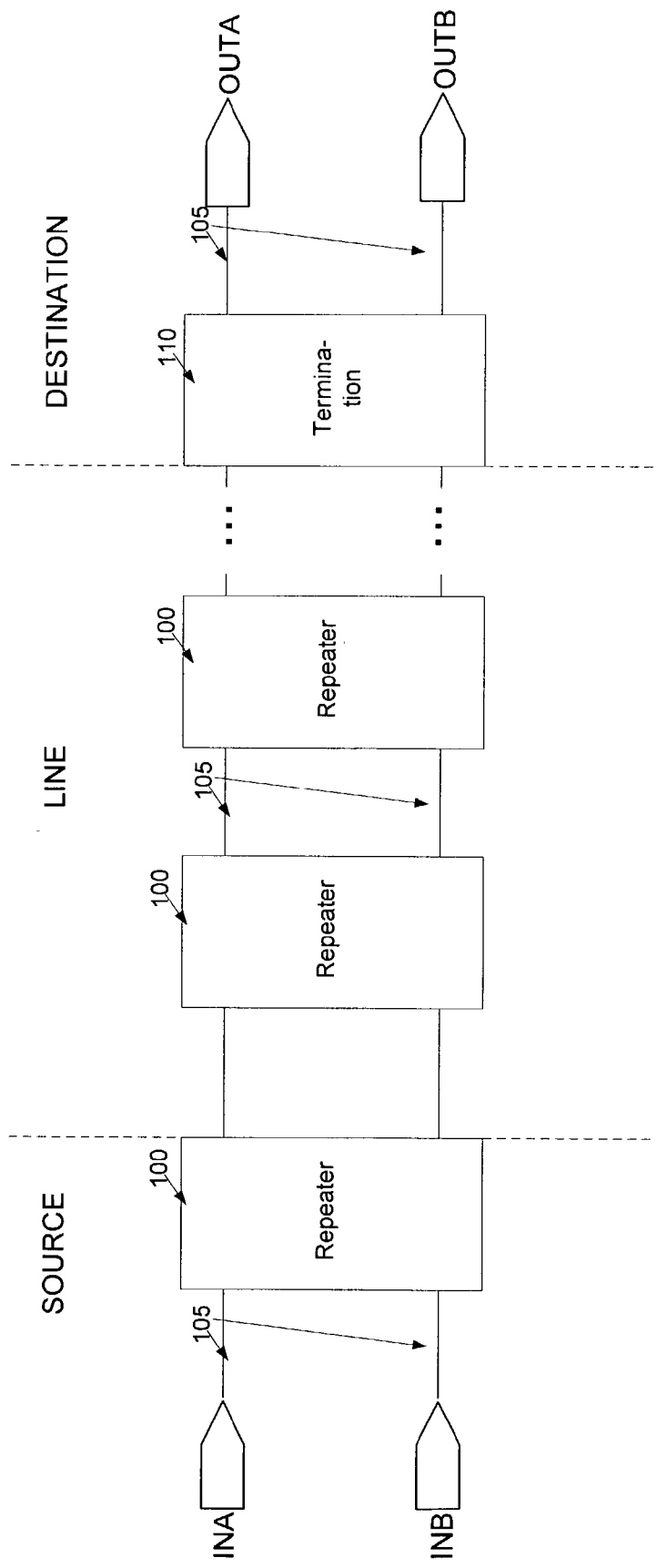
FIG. 1 is a block diagram of a conventional transmission line with repeaters inserted at regular intervals.
Figure 2:
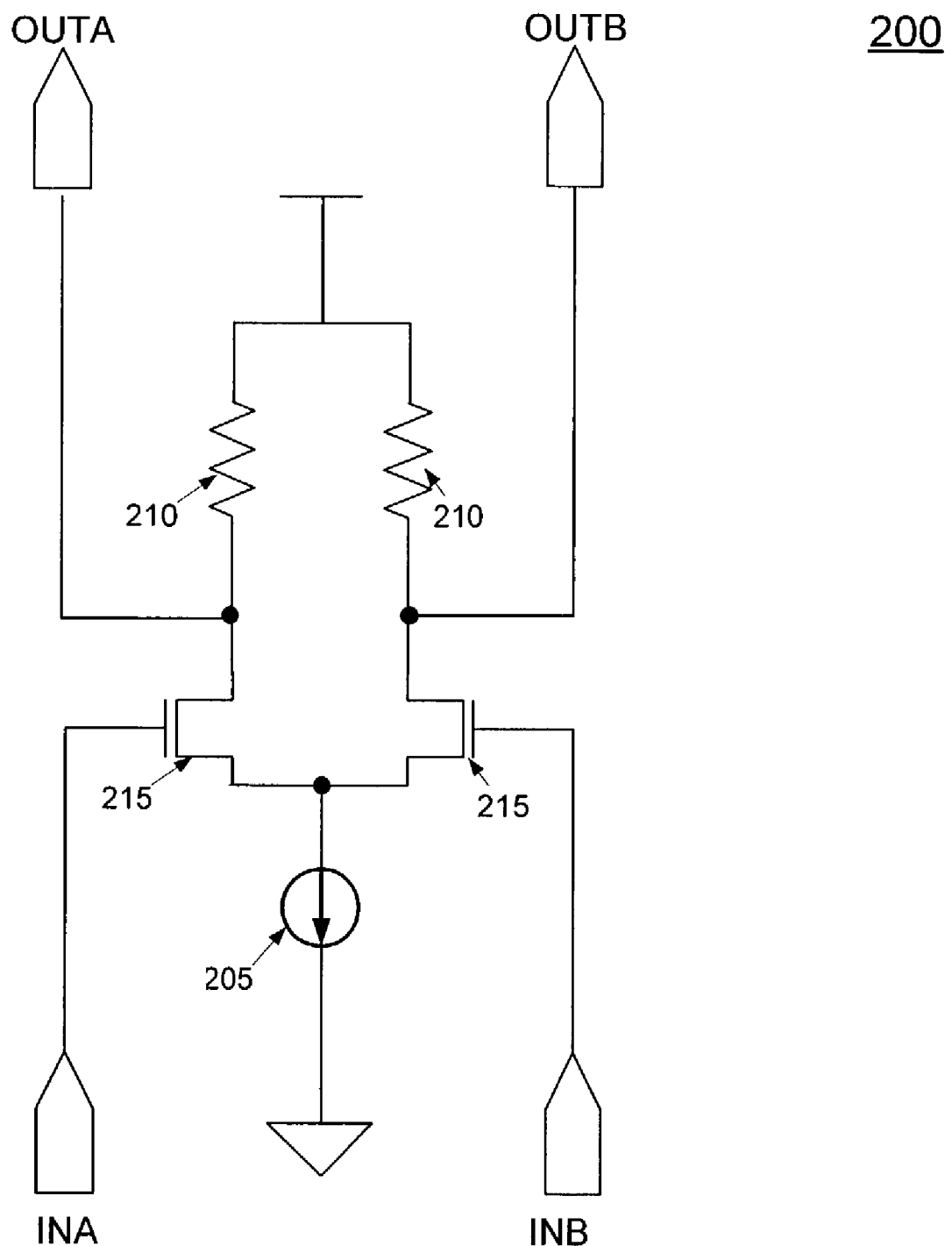
FIG. 2 is a differential amplifier used as a differential repeater.
Figure 3:
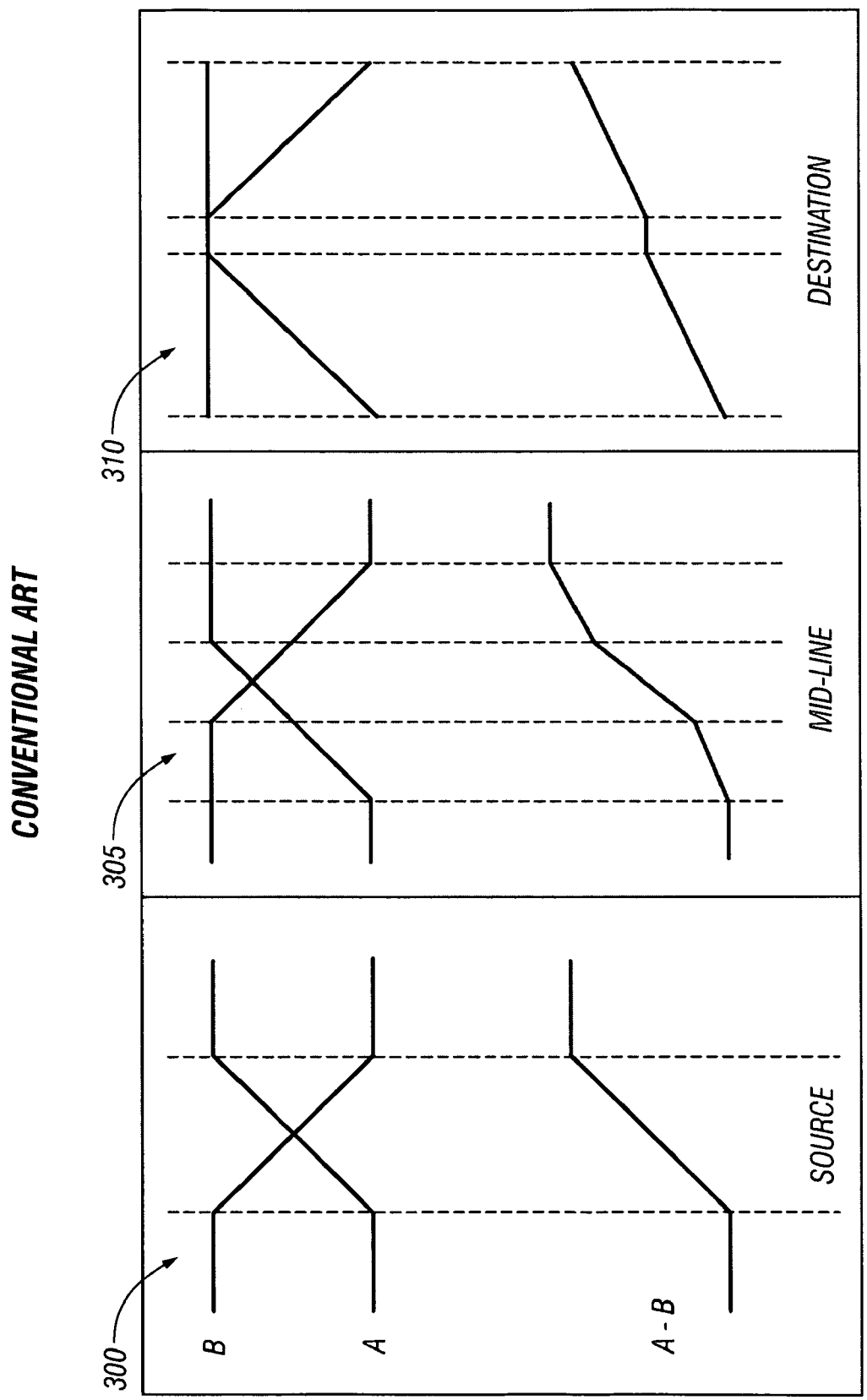
FIG. 3 is a diagram illustrating skew build-up as a signal propagates along a transmission line.
Figure 4:
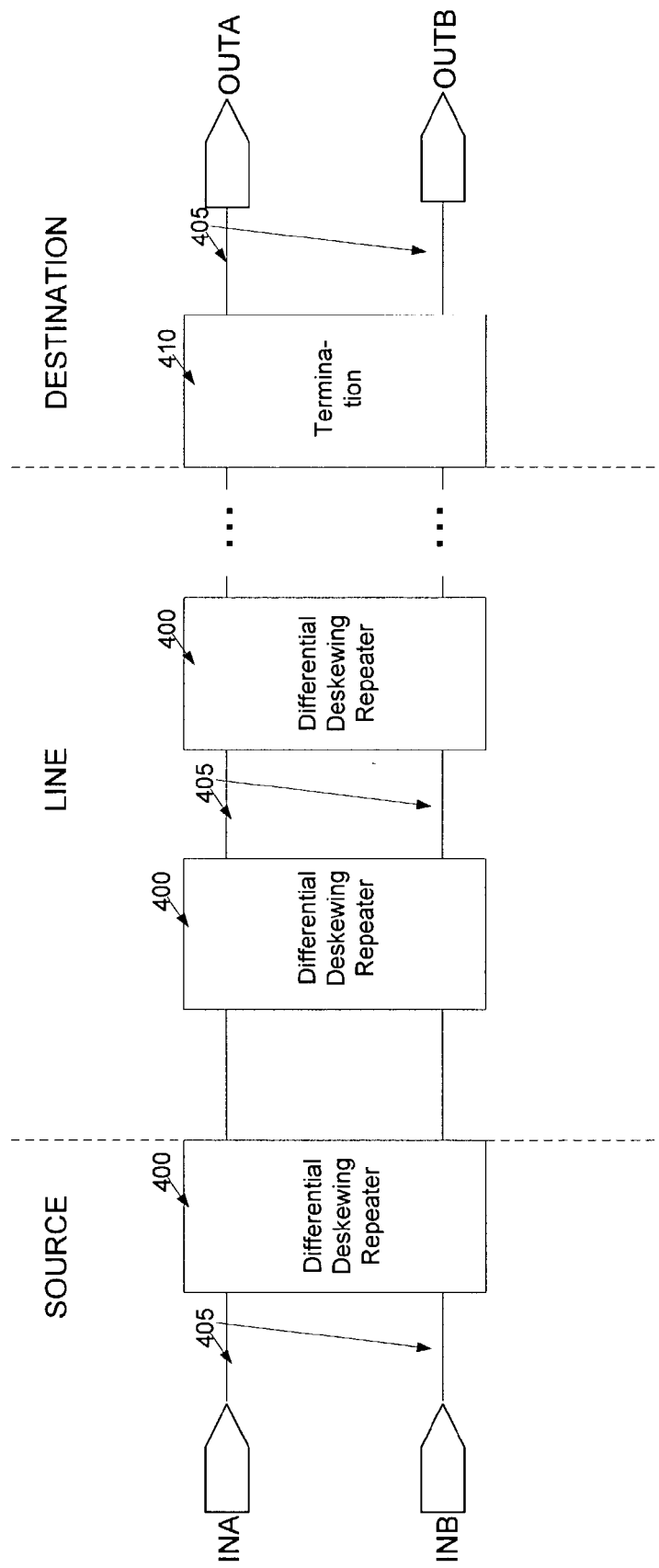
FIG. 4 is an exemplary block diagram of a transmission line with differential deskewing repeaters (DDRs) inserted at regular intervals.

FIG. 4 shows a transmission line 405 including two inputs at a source and two outputs at a destination. One or more differential deskewing repeaters (DDRs) 400 may be inserted along a transmission line 405 at predetermined intervals. A termination block 410 may be connected to the end of the transmission line 405 and may be optionally used for interfacing the received differential pair signal with a receiving circuit (not shown).

Figure 5:
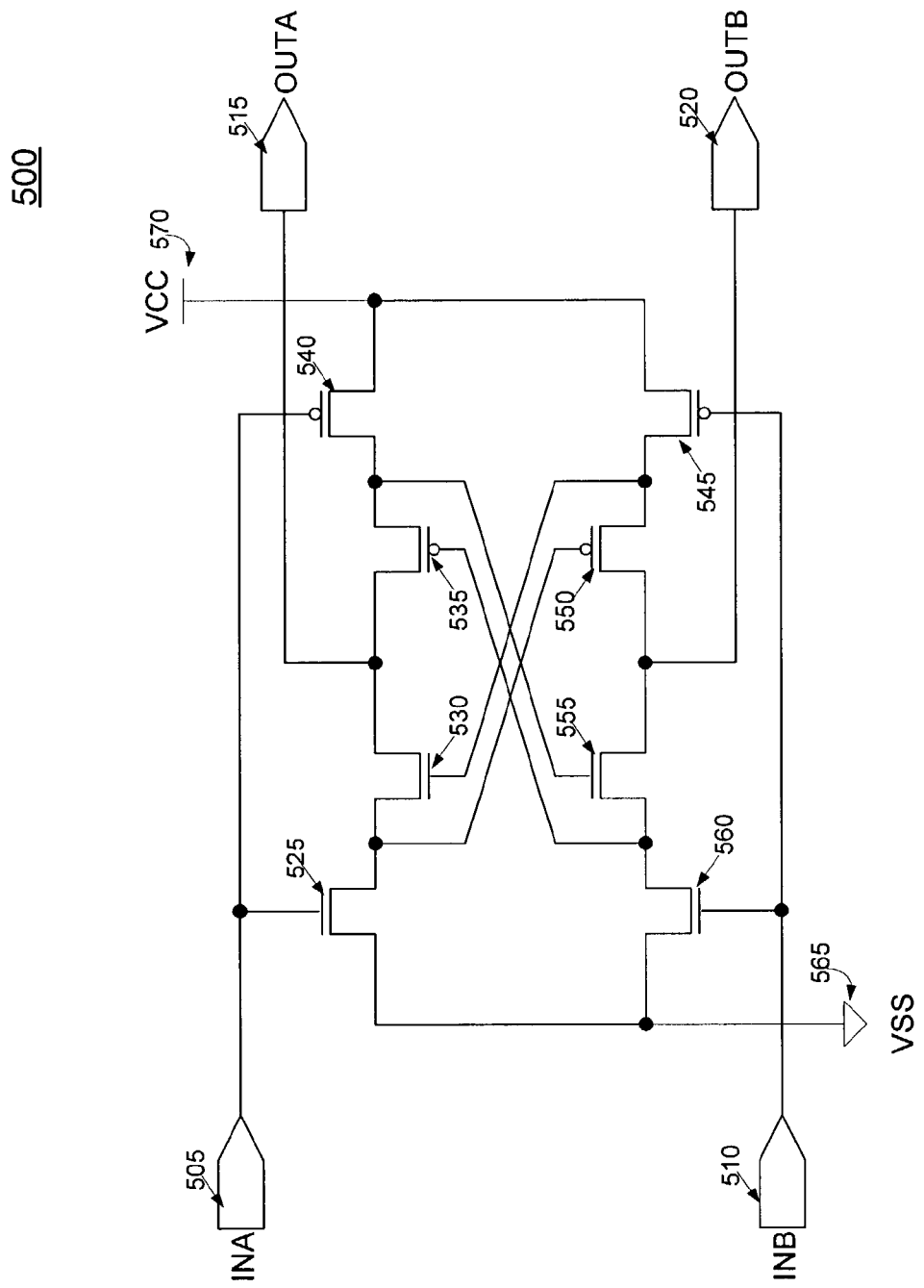
FIG. 5 is an exemplary circuit diagram of a DDR.

The DDRs serve to both refresh the differential pair signal (i.e., shorten signal transition times and restore the signal levels to levels substantially close to their original levels prior to signal propagation) and deskew the differential pair signal (i.e., eliminate any time delay between the two signals forming the differential pair) that travels along the transmission line 405. FIG. 5 shows an example of a differential deskewing repeater (DDR) 500 that includes eight transistors 525-560. As shown, transistors 525, 530, 555, and 560 are n-type transistors and transistors 535, 540, 545 and 550 are p-type transistors. Other implementations may employ different numbers of n-type and p-type transistors.

The DDR circuit 500 receives differential inputs INA 505 and INB 510. In general, the differential inputs INA 505 and INB 510 are complementary and switch between the supply rail voltages (i.e., between VSS and VCC). Outputs OUTA 515 and OUTB 520 are complementary to inputs INA 505 and INB 510 (i.e., after switching is complete, OUTA 515 is the inverse of INA 505 and OUTB 520 is the inverse of INB 510).

The input INA 505 is coupled to the gate of the n-type transistor 525 and the gate of the p-type transistor 540. The input INB 510 is coupled to the gate of the n-type transistor 560 and the gate of the p-type transistor 545.

A supply rail voltage VSS 565 is coupled to the source of n-type transistor 525 and the source of n-type transistor 560. A supply rail voltage VCC 570 is coupled to the source of the p-type transistor 540 and the source of the p-type transistor 545.

As shown in FIG. 5, the drain of the n-type transistor 525 is coupled to the source of the n-type transistor 530 and the gate of the p-type transistor 550. The gate of the n-type transistor 530 is coupled to the drain of the p-type transistor 545 and the source of the p-type transistor 550. The drain of the n-type transistor 530 is coupled to the output OUTA 515 and the drain of the p-type transistor 535. The gate of the p-type transistor 535 is coupled to the drain of the n-type transistor 560 and the source of the n-type transistor 555. The source of the p-type transistor 535 is coupled to the drain of the p-type transistor 540 and the gate of the n-type transistor 555. The drain of the n-type transistor 555 is coupled to the drain of the p-type transistor 550 and the output OUTB 520.

The DDR circuit 500 may eliminate skew between the differential inputs INA 505 and INB 510 by switching OUTA 515 and OUTB 520 only when both INA 505 and INB 510 switch. For example, if INA 505 switches before INB 510 switches, the outputs OUTA 515 and OUTB 520 do not switch until INB 510 switches. Likewise, if INB 510 switches before INA 505 switches, the outputs OUTA 515 and OUTB 520 do not switch until input INA 505 switches. Therefore, if any skew has occurred in the differential pair signal applied to the inputs INA 505 and INB 510, the DDR circuit 500 ensures that no skew propagates to the differential pair signal outputs OUTA 515 and OUTB 520. Furthermore, the DDR circuit 500 refreshes the differential pair signal by driving the outputs OUTA 515 and OUTB 520 with VSS 565 and VCC 570 using the combination of transistors that are turned on. The operation of DDR circuit 500 may be illustrated using the examples shown in FIGS. 6-8.

Figure 6:
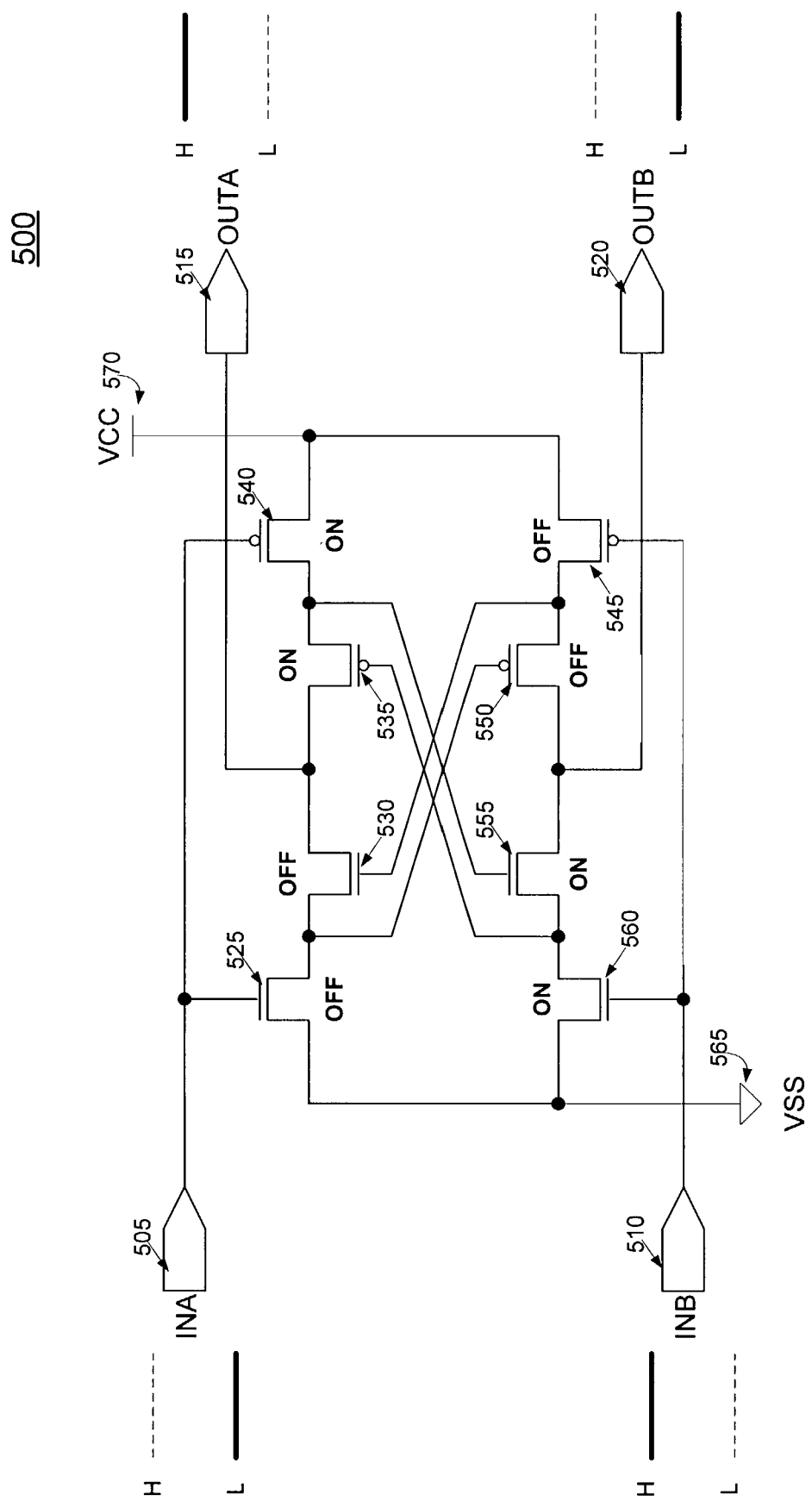
FIGS. 6-8 are circuit diagrams of the DDR of FIG. 5 with input and output signals shown.

As shown in FIG. 6, INA 505 receives a low input and INB 510 receives a high input. The low input to INA 505 turns off the n-type transistor 525 and turns on the p-type transistor 540, which results in a high potential at the drain of the p-type transistor 540 to turn on n-type transistor 555. Similarly, the high input to INB 510 turns off the p-type transistor 545 and turns on the n-type transistor 560, which pulls the drain of the n-type transistor 560 to a low potential to turn on the p-type transistor 535. Because both p-type transistors 535 and 540 are turned on, a high potential results on the output OUTA 515. Likewise, the turned on n-type transistors 555 and 560 cause a low potential on the output OUTB 520.

Ideally, the differential pair signals are complementary such that a transition in one of the signals (e.g., INA 505) results in a simultaneous and opposite transition in the other signal (e.g., INB 510). However, under actual operating conditions skew results from a delay between the transition of one signal and the transition of the other due to the physical mismatch between the two transmission lines on which the signal travels.

Figure 7:
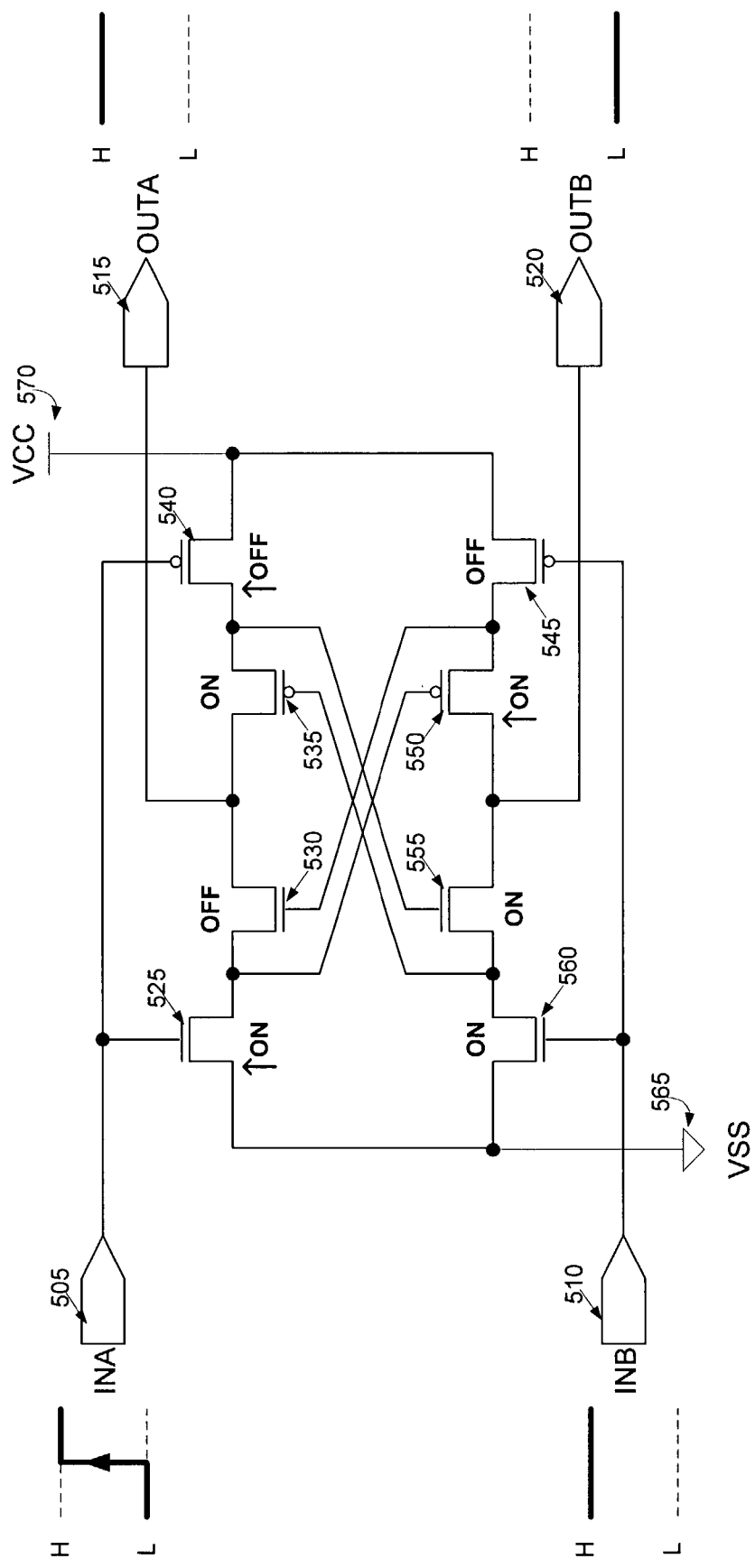

FIG. 7 shows the operation of the DDR circuit 500 when there is some skew between the differential pair. As shown in FIG. 7, INA 505 transitions to a high potential before INB 510 transitions to a low level potential. When INA 505 transitions to a high potential, the n-type transistor 525 turns on, pulling its drain voltage low, which turns on the p-type transistor 550. However, the potential at OUTB 520 remains low because the p-type transistor 545 remains off and the n-type transistors 555 and 560 remain on. The transition of INA 505 to a high potential also turns off the p-type transistor 540. However, the output voltage OUTA 515 is not affected because the n-type transistor 530 remains turned off, and, therefore, the output voltage OUTA 515 is not pulled low by VSS 565. Thus, the output voltages OUTA 515 and OUTB 520 remain unchanged despite the transition of the input voltage INA 505.

Figure 8:
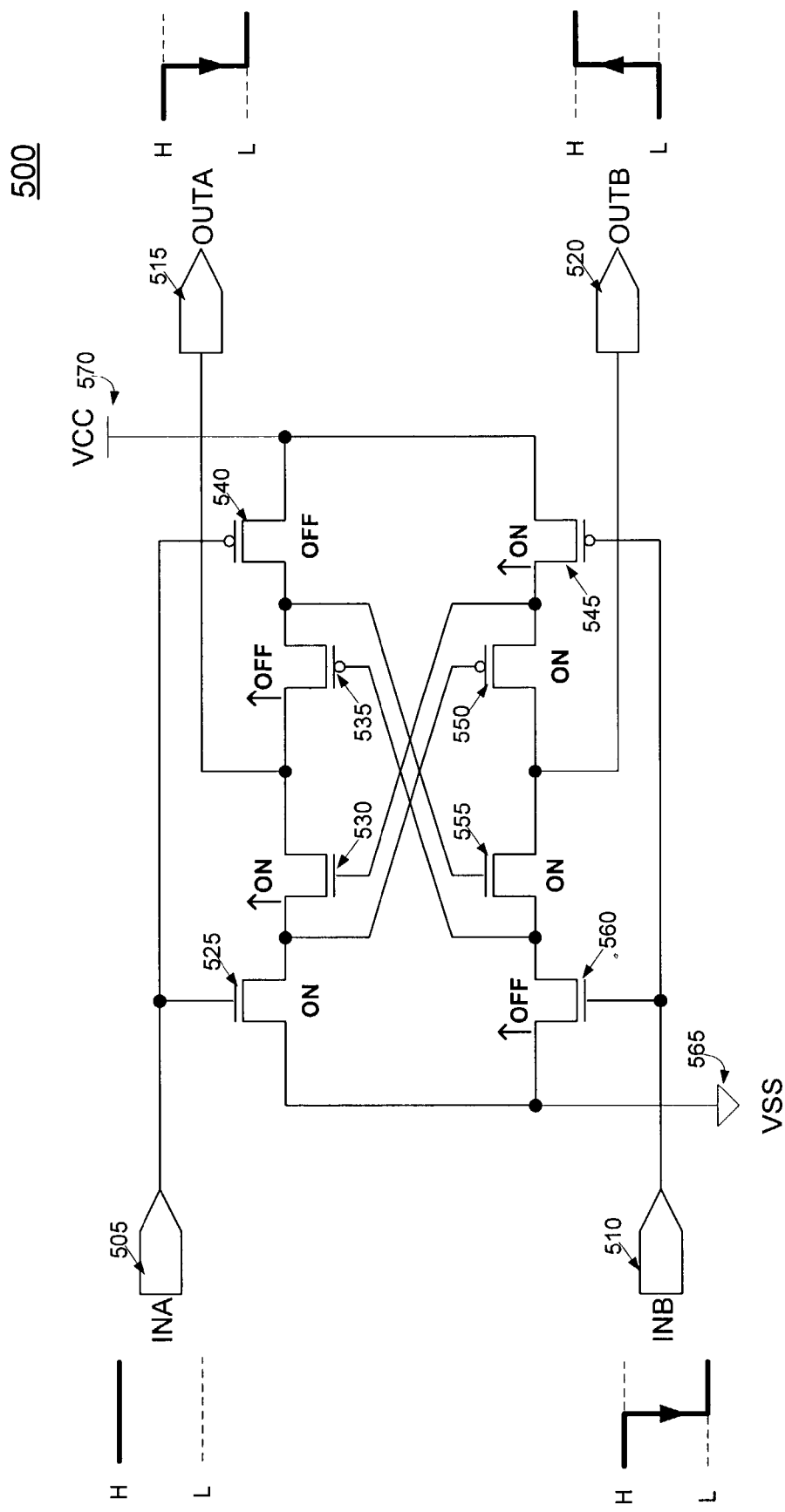

FIG. 8 shows the operation of the DDR circuit 500 when the input voltage INB 510 transitions to a low potential sometime after the input voltage INA 505 has already transitioned to a high potential, for example, as previously described with regard to FIG. 7. The transition of INB 510 to a low potential turns on the p-type transistor 545 and turns off the n-type transistor 560. Turning on transistor 545 pulls the drain voltage of transistor 545 to a high potential, which turns on the n-type transistor 530 and also pulls OUTB 520 to a high potential. Turning on transistor 530 allows transistors 525 and 530 to pull OUTA 515 to a low potential.

As shown by the preceding examples, the outputs OUTA 515 and OUTB 520 transition substantially simultaneously only upon the transition of the later in time of the two differential pair inputs. The differential outputs OUTA 515 and OUTB 520 provide a differential pair signal that is a refreshed complementary copy of the differential pair signal input to the DDR circuit 500. Any skew present in the input signal is eliminated.

The transistor device sizes for the DDR circuit 500 may be selected using simulations approximating actual device conditions. Specifically, the device sizes may be chosen to cause outputs OUTA 515 and OUTB 520 to cross-over at the voltage midpoint between VCC 570 and VSS 565 when they transition between high and low potentials.

The DDR circuit 500 dissipates very little power because the circuit consumes current only during switching. The switching current is composed of current that charges up parasitic capacitances and a rush-through current that travels through the transistors when a momentary low-resistance path from VCC 570 to VSS 565 is established during switching. Therefore, the DDR circuit 500 current consumption is, for example, on the order of a CMOS logic gate having similar transistor sizes. As a result, the DDR circuit 500 consumes less current and dissipate less power than repeaters that use a DC current source and constantly consume current.

The drive capability of the DDR circuit 500 also eliminates the need for a pair of resistors at the output of the repeater, which may degrade the output because of the combination of the output resistance in parallel with the transmission line capacitance (e.g., acting as a low-pass filter that attenuates high-frequency signal components.) The power consumption of the DDR circuit 500 is lower than repeaters which require a higher DC current source to offset the high output resistance. The repeater circuit 500 also provides relatively low output resistance and good drive capability, which is particularly suited to driving high frequency differential pair clock signals.

Figure 9:
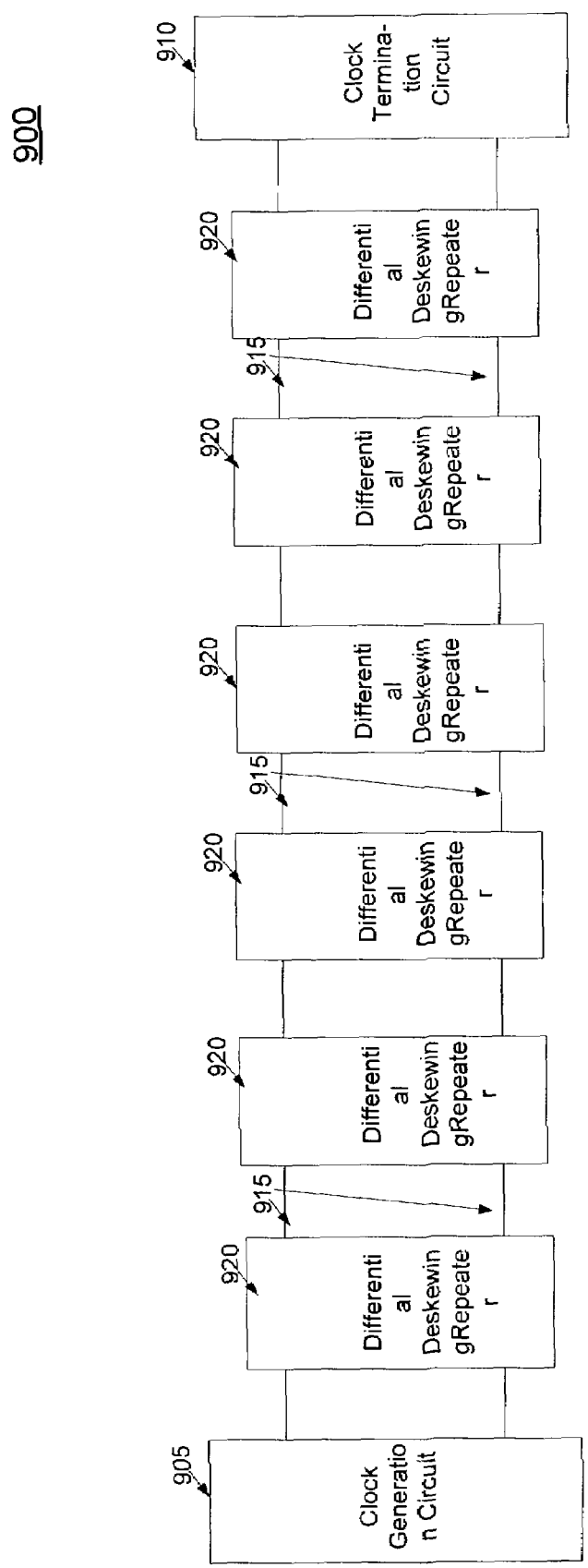
FIG. 9 is an exemplary block diagram of a clock transmission circuit using a DDR of FIG. 5.

FIG. 9 shows a clock transmission circuit 900 that includes a clock generation circuit 905 connected to a clock termination circuit 910 through a transmission line 915. DDRs 920 are inserted along the transmission line 915 at regular intervals.

The clock generation circuit 905 may generate a high frequency clock signal. A high frequency clock signal is usually transmitted as a differential pair to minimize the effects of noise. Because both signals of the differential pair are affected roughly in the same manner by noise, the noise can be canceled out between the pair of clock signals.

The clock generation circuit 905 includes a circuit that generates the differential-pair clock signals. This circuit may include an oscillator circuit (not shown) to generate a clock signal at a particular frequency in conjunction with a phase-locked loop circuit (not shown) to adjust the frequency of the clock signal.

The clock termination circuit 910 includes a circuit that uses the clock signals for timing. This circuit may convert the differential-pair clock signals to single-ended clock signals depending on the application of the clock signals in the circuit.

The distance that clock-differential pair signals may travel may be limited significantly by noise, skew, and signal strength. Higher frequency clock signals (e.g., 1 GHz and higher) attenuate faster due to the parasitic resistance, inductance, and capacitance of the transmission lines. As a result, higher frequency clock signals are sensitive to noise and skew. Therefore, these signals may be refreshed and deskewed more often than lower frequency signals.

In the exemplary circuit shown in FIG. 9, a differential clock signal may travel a long distance via transmission line 915 with the use of DDRs 920. The spacing between DDRs 920 will vary depending on the frequency of the repeated signal and the noise characteristics of the environment in any specific implementation.

The DDRs 920 refresh the differential pair clock signal and deskew the differential pair clock signal. The regular refreshing and deskewing of the differential pair clock signal by the DDRs 920 ensures that the signal reaches the clock termination circuit 910 with sufficient strength and signal integrity to be properly used for timing purposes.

Other implementations are within the scope of the following claims.

What is claimed is:

1. A method comprising:
   receiving a differential waveform pair from a transmission line, the differential waveform pair including a first waveform and a second waveform;
   generating a refreshed first output waveform as an inverse of the first waveform after a signal transition of the first waveform and after a complementary signal transition of the second waveform; and
   generating a refreshed second output waveform as an inverse of the second waveform substantially simultaneously with generation of the first output waveform.

2. The method of claim 1 wherein the refreshed first output waveform is a waveform having shorter signal transition times and higher signal levels than the first waveform.

3. The method of claim 2 wherein the refreshed second output waveform is a waveform having shorter signal transition times and higher signal levels than the second waveform.

4. The method of claim 1 wherein generating a refreshed first output waveform and generating a refreshed second output waveform include generating a refreshed first output waveform and a refreshed second output waveform using a CMOS logic circuit.

5. A system comprising:
   a transmission line to receive a differential waveform pair;
   an input to receive the differential waveform pair from the transmission line, the differential waveform pair including a first waveform and a second waveform;
   a repeater to generate a refreshed first output waveform as an inverse of the first waveform after a signal transition of the first waveform and after a complementary signal transition of the second waveform, and to generate a refreshed second output waveform as an inverse of the second waveform substantially simultaneously with generation of the first output waveform; and
   a second transmission line to receive the first output waveform and to receive the second output waveform.

6. The system of claim 5 wherein the repeater comprises a CMOS logic circuit.

7. The system of claim 5 wherein the refreshed first output waveform is a waveform having shorter signal transition times and higher signal levels than the first waveform.

8. The system of claim 7 wherein the refreshed second output waveform is a waveform having shorter signal transition times and higher signal levels than the second waveform.

9. The system of claim 5 wherein the repeater includes:
   a first n-type transistor having a gate coupled to the input to receive the first waveform and a source coupled to a first supply potential; and
   a first p-type transistor having a gate coupled to the input to receive the first waveform and a source coupled to a second supply potential.

10. The system of claim 9 wherein the repeater includes:
    a second n-type transistor having a gate coupled to the input to receive the second waveform and a source coupled to the first supply potential; and
    a second p-type transistor having a gate coupled to the input to receive the second waveform and a source coupled to the second supply potential.

11. The system of claim 10 wherein the repeater includes:
    a third n-type transistor having a source coupled to a drain of the first n-type transistor, a gate coupled to a drain of the second p-type transistor, and a drain coupled to the second transmission line to receive the first output waveform; and
    a third p-type transistor having a gate coupled to the drain of the first n-type transistor and the source of the third n-type transistor, a source coupled to the drain of the second p-type transistor and the gate of the third n-type transistor, and a drain coupled to the second transmission line to receive the second output waveform.

12. The system of claim 11 wherein the repeater includes:
    a fourth n-type transistor having a gate coupled to the drain of the first p-type transistor, a drain coupled to the drain of the third p-type transistor and to the second transmission line to receive the second output waveform, and a source coupled to the drain of the second n-type transistor; and
    a fourth p-type transistor having a gate coupled to the drain of the second n-type transistor and to the source of the fourth n-type transistor, a source coupled to the gate of the fourth n-type transistor and to the drain of the first p-type transistor, and a drain coupled to the drain of the third n-type transistor and to the second transmission line to receive the first output waveform.

13. The system of claim 5 further comprising a second repeater
    to receive the first output waveform and the second output waveform from the second transmission line;
    to generate a refreshed third output waveform as an inverse of the first output waveform after a signal transition of the first output waveform and after a complementary signal transition of the second output waveform; and
    to generate a refreshed fourth output waveform as an inverse of the second output waveform substantially simultaneously with generation of the third output waveform.

14. A system comprising:
    generation circuitry to generate a differential waveform pair, the differential waveform pair comprising a first waveform and a second waveform;

a transmission line to receive the differential waveform pair from the generation circuitry;

an input to receive the differential waveform pair from the transmission line;

a repeater to generate a refreshed first output waveform as an inverse of the first waveform after a signal transition of the first waveform and after a complementary signal transition of the second waveform, and to generate a refreshed second output waveform as an inverse of the second waveform substantially simultaneously with generation of the first output waveform;

a second transmission line to receive the first output waveform and to receive the second output waveform; and termination circuitry to accept the differential waveform pair from the second transmission line.

15. The system of claim 14 wherein the repeater comprises a CMOS logic circuit.

16. The system of claim 14 wherein the refreshed first output waveform is a waveform having shorter signal transition times and higher signal levels than the first waveform.

17. The system of claim 16 wherein the refreshed second output waveform is a waveform having shorter signal transition times and higher signal levels than the second waveform.

18. The system of claim 14 wherein the repeater includes:
a first n-type transistor having a gate coupled to the input to receive the first waveform and a source coupled to a first supply potential; and
a first p-type transistor having a gate coupled to the input to receive the first waveform and a drain coupled to a second supply potential.

19. The system of claim 18 wherein the repeater includes:
a second n-type transistor having a gate coupled to the input to receive the second waveform and a source coupled to the first supply potential; and
a second p-type transistor having a gate coupled to the input to receive the second waveform and a drain coupled to the second supply potential.

20. The system of claim 19 wherein the repeater includes:
a third n-type transistor having a source coupled to a drain of the first n-type transistor, a gate coupled to a drain of the second p-type transistor, and a drain coupled to the second transmission line to receive the first output waveform; and
a third p-type transistor having a gate coupled to the drain of the first n-type transistor and the source of the third n-type transistor, a source coupled to the drain of the second p-type transistor and the gate of the third n-type transistor, and a drain coupled to the second transmission line to receive the second output waveform.

21. The system of claim 20 wherein the repeater includes:
a fourth n-type transistor having a gate coupled to the drain of the first p-type transistor, a drain coupled to the drain of the third p-type transistor and to the second transmission line to receive the second output waveform, and a source coupled to the drain of the second n-type transistor; and
a fourth p-type transistor having a gate coupled to the drain of the second n-type transistor and to the source of the fourth n-type transistor, a source coupled to the gate of the fourth n-type transistor and to the drain of the first p-type transistor, and a drain coupled to the drain of the third n-type transistor and to the second transmission line to receive the first output waveform.

22. The system of claim 21 further comprising a second repeater
to receive the first output waveform and the second output waveform from the second transmission line;
to generate a refreshed third output waveform as an inverse of the first output waveform after a signal transition of the first output waveform and after a complementary signal transition of the second output waveform; and
to generate a refreshed fourth output waveform as an inverse of the second output waveform substantially simultaneously with generation of the third output waveform.

23. A system comprising:
clock generation circuitry to generate a differential pair clock signal, the differential pair clock signal comprising a first clock signal and a second clock signal;
a transmission line to receive the differential pair clock signal from the clock generation circuitry;
an input to receive the differential pair clock signal from the transmission line;
a repeater to generate a refreshed first clock signal output as an inverse of the first clock signal after a signal transition of the first clock signal and after a complementary signal transition of the second clock signal, and to generate a refreshed second clock signal output as an inverse of the second clock signal substantially simultaneously with generation of the first clock signal output;
a second transmission line to receive the first clock signal output and to receive the second clock signal output; and
termination circuitry to accept the first clock signal output and to accept the second clock signal output from the second transmission line.

24. The system of claim 23 wherein the repeater comprises a CMOS logic circuit.

25. The system of claim 23 wherein the refreshed first clock signal output is a waveform having shorter signal transition times and higher signal levels than the first clock signal.

26. The system of claim 25 wherein the refreshed second clock signal output is a waveform having shorter signal transition times and higher signal levels than the second clock signal.

27. The system of claim 23 wherein the repeater includes:
a first n-type transistor having a gate coupled to the input to receive the first clock signal and a source coupled to a first supply potential; and
a first p-type transistor having a gate coupled to the input to receive the first clock signal and a drain coupled to a second supply potential.

28. The system of claim 27 wherein the repeater includes:
a second n-type transistor having a gate coupled to the input to receive the second clock signal and a source coupled to the first supply potential; and
a second p-type transistor having a gate coupled to the input to receive the second clock signal and a drain coupled to the second supply potential.

29. The system of claim 28 wherein the repeater includes:
a third n-type transistor having a source coupled to a drain of the first n-type transistor, a gate coupled to a drain of the second p-type transistor, and a drain coupled to the second transmission line to receive the first clock signal output; and
a third p-type transistor having a gate coupled to the drain of the first n-type transistor and the source of the third n-type transistor, a source coupled to the drain of the second p-type transistor and the gate of the third n-type transistor, and a drain coupled to the second transmission line to receive the second clock signal output.

30. The system of claim 29 wherein the repeater includes:
a fourth n-type transistor having a gate coupled to the drain of the first p-type transistor, a drain coupled to the drain of the third p-type transistor and to the second transmission line to receive the second clock signal output, and a source coupled to the drain of the second n-type transistor; and
a fourth p-type transistor having a gate coupled to the drain of the second n-type transistor and to the source of the fourth n-type transistor, a source coupled to the gate of the fourth n-type transistor and to the drain of the first p-type transistor, and a drain coupled to the drain of the third n-type transistor and to second transmission line to receive the first clock signal output.

31. The system of claim 23 further comprising a second repeater
to receive the first clock signal output and the second clock signal output from the second transmission line;
to generate a refreshed third clock signal output as an inverse of the first clock signal output after a signal transition of the first clock signal output and after a complementary signal transition of the second clock signal output; and
to generate a refreshed fourth clock signal output as an inverse of the second clock signal output substantially simultaneously with generation of the third clock signal output.

* * * * *